(12) United States Patent
Leeser

(10) Patent No.: US 10,550,469 B2
(45) Date of Patent: Feb. 4, 2020

(54) PLASMA EXCITATION FOR SPATIAL ATOMIC LAYER DEPOSITION (ALD) REACTORS

(71) Applicant: Lam Research Corporation, Fremont, CA (US)

(72) Inventor: Karl F. Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 845 days.

(21) Appl. No.: 14/846,697

(22) Filed: Sep. 4, 2015

(65) Prior Publication Data

US 2017/0067156 A1 Mar. 9, 2017

(51) Int. Cl.
*C23C 16/455* (2006.01)
*H01J 37/32* (2006.01)
(Continued)

(52) U.S. Cl.
CPC .......... *C23C 16/4554* (2013.01); *C23C 14/56* (2013.01); *C23C 14/564* (2013.01); *C23C 14/568* (2013.01); *C23C 16/4401* (2013.01); *C23C 16/458* (2013.01); *C23C 16/4583* (2013.01); *C23C 16/45519* (2013.01); *C23C 16/45521* (2013.01); *C23C 16/45551* (2013.01); *C23C 16/509* (2013.01); *C23C 16/52* (2013.01); *C23C 16/56* (2013.01); *H01J 37/3244* (2013.01); *H01J 37/32091* (2013.01); *H01J 37/32568* (2013.01); *H01J 37/32715* (2013.01); *H01J 37/32743* (2013.01);
(Continued)

(58) Field of Classification Search
CPC .......... C23C 16/4554; C23C 16/45551; C23C 16/45519; C23C 16/509; C23C 16/52; C23C 16/458; C23C 16/4583; C23C 16/54; C23C 14/56; C23C 14/564; C23C 14/568; C23C 16/4401; C23C 16/45521; H01J 37/3244; H01J 37/32788; H01J 37/32743; H01J 37/32568; H01J 37/32091; H01J 37/32715; H01J 2237/3321; H01J 2237/3323; H01J 2237/327; H01L 21/67155; H01L 21/67173; H01L 21/67126
USPC .............................. 118/715, 723 E
See application file for complete search history.

(56) References Cited

U.S. PATENT DOCUMENTS 6,042,686 A * 3/2000 Dible ................ H01J 37/32009
  118/723 E
6,367,413 B1 * 4/2002 Sill ........................ H01J 37/321
  118/723 E (Continued)

*Primary Examiner* — Jeffrie R Lund
(74) *Attorney, Agent, or Firm* — Penilla IP, APC

(57) ABSTRACT

A spatial atomic layer deposition (ALD) system is disclosed. The system includes a chamber that includes a plurality of zones oriented along a track. Also included is a shuttle that is configured to support the substrate and transport the substrate to each of the plurality of zones to enable deposition of a thin film. The shuttle includes an RF power electrode and an RF ground electrode coupled to an RF power source. The RF electrode and the RF ground electrode are each embedded in the shuttle, such that power provided by the RF power source to the shuttle moves with the shuttle to each of the zones. The RF power source is configured to be activated in synchronization with moving the shuttle to one of the zones.

12 Claims, 12 Drawing Sheets

(51) Int. Cl.
| | |
|---|---|
| *C23C 16/458* | (2006.01) |
| *C23C 16/52* | (2006.01) |
| *C23C 16/509* | (2006.01) |
| *C23C 14/56* | (2006.01) |
| *C23C 16/56* | (2006.01) |
| *C23C 16/44* | (2006.01) |
| *H01L 21/67* | (2006.01) |

(52) U.S. Cl.
CPC .. *H01J 37/32788* (2013.01); *H01L 21/67155* (2013.01); *H01L 21/67161* (2013.01); *H01L 21/67173* (2013.01); *H01J 2237/327* (2013.01); *H01J 2237/3321* (2013.01); *H01J 2237/3323* (2013.01)

(56) References Cited

U.S. PATENT DOCUMENTS

| | | | | |
|---|---|---|---|---|
| 6,881,269 | B2* | 4/2005 | Matsuzawa | B05D 1/62 118/719 |
| 6,902,620 | B1* | 6/2005 | Omstead | C23C 16/45551 117/102 |
| 7,767,054 | B2* | 8/2010 | Kobayashi | C23F 4/00 156/345.3 |
| 8,956,456 | B2* | 2/2015 | Vermeer | C23C 16/45551 118/715 |
| 9,852,889 | B1* | 12/2017 | Kellogg | H01J 37/32091 |
| 10,096,475 | B1* | 10/2018 | Shaikh | H01L 21/0332 |
| 2004/0018305 | A1* | 1/2004 | Pagano | H01L 21/67236 427/255.7 |
| 2004/0026374 | A1* | 2/2004 | Nguyen | H01L 21/67173 216/89 |
| 2004/0065255 | A1* | 4/2004 | Yang | C23C 16/45519 118/715 |
| 2004/0067641 | A1* | 4/2004 | Yudovsky | C23C 16/4412 438/680 |
| 2007/0218701 | A1* | 9/2007 | Shimizu | C23C 16/06 438/758 |
| 2007/0218702 | A1* | 9/2007 | Shimizu | C23C 16/06 438/758 |
| 2007/0235412 | A1* | 10/2007 | Fischer | H01J 37/32082 216/71 |
| 2007/0269612 | A1* | 11/2007 | Bijker | C23C 4/12 427/569 |
| 2008/0017318 | A1* | 1/2008 | Kobayashi | C23C 16/4401 156/345.43 |
| 2008/0202689 | A1* | 8/2008 | Kim | H01J 37/32477 156/345.43 |
| 2010/0209082 | A1* | 8/2010 | He | C23C 16/4412 392/411 |
| 2010/0229793 | A1* | 9/2010 | He | C23C 16/45565 118/715 |
| 2010/0260935 | A1* | 10/2010 | Kato | C23C 16/402 427/255.28 |
| 2011/0096461 | A1* | 4/2011 | Yoshikawa | H01L 21/6833 361/234 |
| 2011/0244690 | A1* | 10/2011 | Shanker | C23C 16/44 438/703 |
| 2011/0253672 | A1* | 10/2011 | Kamibayashi | H01J 37/32091 216/61 |
| 2011/0256726 | A1* | 10/2011 | LaVoie | C23C 16/045 438/702 |
| 2011/0290175 | A1* | 12/2011 | Paranjpe | C30B 25/025 117/85 |
| 2012/0114877 | A1* | 5/2012 | Lee | C23C 16/45538 427/569 |
| 2012/0141676 | A1* | 6/2012 | Sershen | C23C 16/45551 427/255.23 |
| 2012/0164834 | A1* | 6/2012 | Jennings | H01J 37/32082 438/694 |
| 2012/0222616 | A1* | 9/2012 | Han | C23C 16/4401 118/723 E |
| 2012/0223048 | A1* | 9/2012 | Paranjpe | C23C 14/042 216/22 |
| 2012/0225195 | A1* | 9/2012 | Yudovsky | C23C 16/45551 427/58 |
| 2012/0225204 | A1* | 9/2012 | Yudovsky | C23C 16/45551 427/248.1 |
| 2012/0225219 | A1* | 9/2012 | Yudovsky | C23C 16/45551 427/595 |
| 2012/0231158 | A1* | 9/2012 | Ueno | C23C 14/50 427/128 |
| 2013/0012029 | A1* | 1/2013 | Vermeer | C23C 16/0245 438/758 |
| 2013/0137267 | A1* | 5/2013 | Chang | H01J 37/3244 438/694 |
| 2013/0164445 | A1* | 6/2013 | Kwong | C23C 16/448 427/255.5 |
| 2013/0210241 | A1* | 8/2013 | LaVoie | H01L 21/02164 438/791 |
| 2013/0273262 | A1* | 10/2013 | Vellaikal | C23C 16/45565 427/569 |
| 2014/0023794 | A1* | 1/2014 | Mahajani | C23C 16/325 427/535 |
| 2014/0120737 | A1* | 5/2014 | Swaminathan | C23C 16/45527 438/765 |
| 2014/0127404 | A1* | 5/2014 | Yudovsky | C23C 16/4412 427/248.1 |
| 2014/0212735 | A1* | 7/2014 | Li | H01M 4/134 429/162 |
| 2015/0162214 | A1* | 6/2015 | Thompson | H01L 21/32051 438/669 |
| 2015/0194298 | A1* | 7/2015 | Lei | H01L 21/0217 438/680 |
| 2015/0252477 | A1* | 9/2015 | Nguyen | C23C 16/24 427/569 |
| 2015/0255243 | A1* | 9/2015 | Godet | H01J 37/32091 216/38 |
| 2015/0255324 | A1* | 9/2015 | Li | H01L 21/02274 438/778 |
| 2016/0024653 | A1* | 1/2016 | Forster | H01J 37/321 427/569 |
| 2016/0024657 | A1* | 1/2016 | Sakamoto | C23C 16/509 427/489 |
| 2016/0068953 | A1* | 3/2016 | Li | C23C 16/4412 118/712 |
| 2016/0097122 | A1* | 4/2016 | Yudovsky | C23C 16/45544 118/725 |
| 2016/0097124 | A1* | 4/2016 | Huh | C23C 16/50 427/58 |
| 2016/0099144 | A1* | 4/2016 | Saly | C23C 16/402 438/787 |
| 2016/0215392 | A1* | 7/2016 | Yudovsky | C23C 16/45551 |
| 2017/0067156 | A1* | 3/2017 | Leeser | C23C 16/4554 |
| 2017/0107614 | A1* | 4/2017 | Lee | C23C 16/345 |
| 2017/0236733 | A1* | 8/2017 | Leeser | C23C 16/45544 700/121 |
| 2017/0287677 | A1* | 10/2017 | Kato | H01J 37/3211 |
| 2017/0350013 | A1* | 12/2017 | Chan | C23C 16/08 |
| 2017/0370001 | A1* | 12/2017 | Yudovsky | C23C 16/52 |
| 2018/0040470 | A1* | 2/2018 | Li | H01L 21/0228 |
| 2018/0076023 | A1* | 3/2018 | Yan | H01L 21/0228 |
| 2018/0182634 | A1* | 6/2018 | Smith | H01L 21/31122 |
| 2018/0211862 | A1* | 7/2018 | Konkola | H01L 21/6833 |

\* cited by examiner

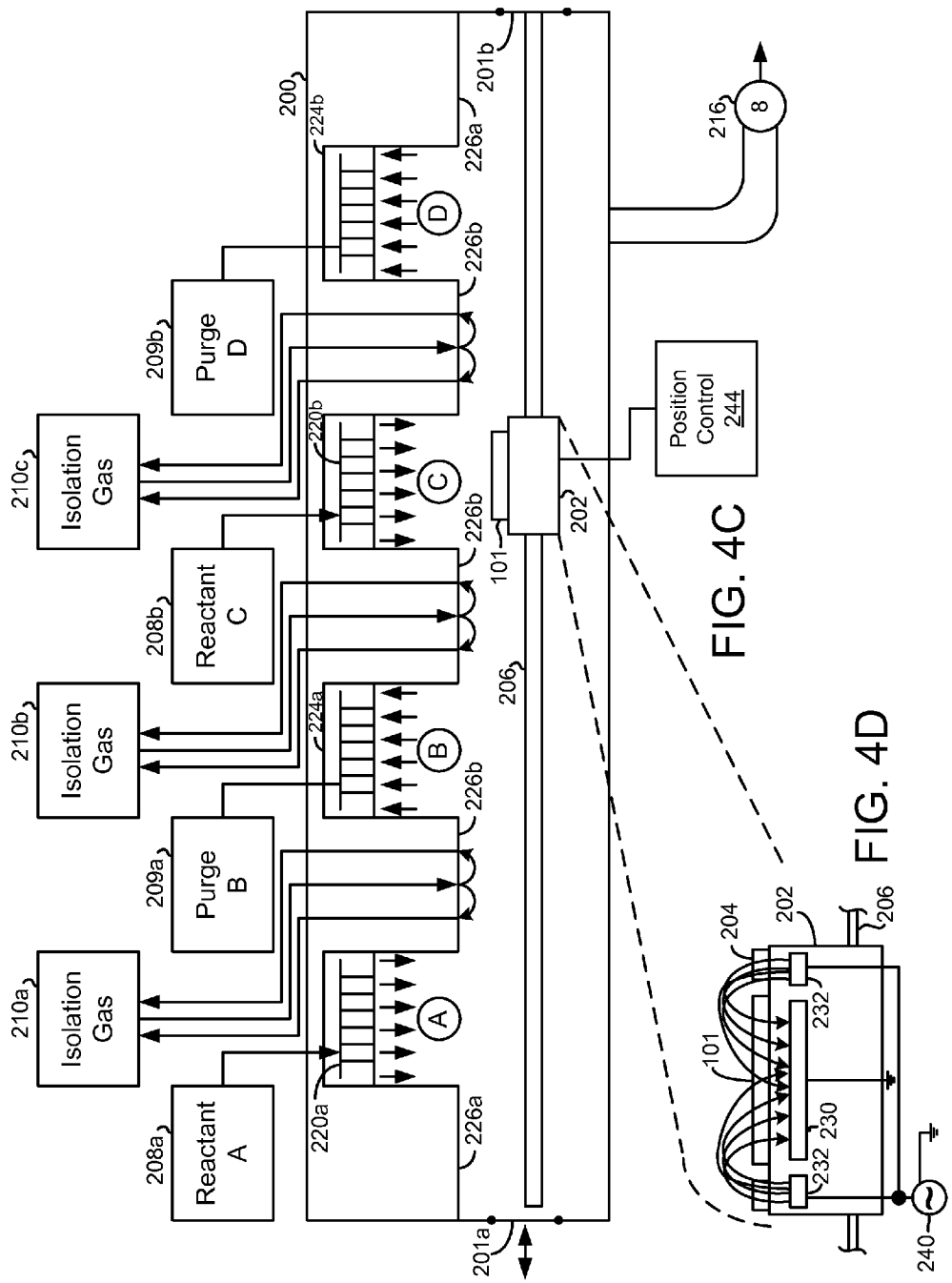

PLASMA EXCITATION FOR SPATIAL ATOMIC LAYER DEPOSITION (ALD) REACTORS

BACKGROUND

1. Field of the Disclosure

The present embodiments relate to semiconductor substrate processing methods and equipment tools, and more particularly, atomic layer deposition (ALD) systems that enable spatial ALD with a moving RF source.

2. Description of the Related Art

Atomic layer deposition (ALD), also known as atomic layer chemical vapor deposition (ALCVD), is a method for producing very thin films that are highly conformal, smooth, and possess excellent physical properties. ALD uses volatile gases, solids, or vapors that are sequentially introduced (or pulsed) over a heated substrate. A first precursor is introduced as a gas, which is absorbed (or adsorbed) into the substrate and the reactor chamber is cleared of the gaseous precursor. A second precursor is introduced as a gas, which reacts with the absorbed precursor to form a monolayer of the desired material. By regulating this sequence, the films produced by ALD are deposited a monolayer at a time by repeatedly switching the sequential flow of two or more reactive gases over the substrate.

Throughput of the typical ALD system is limited. The limitations of gas switching technology, as well as the time required to purge the single substrate showerhead and reactor introduce inherent delays.

One type of emerging atomic layer deposition (ALD) reactor is spatial ALD wherein rather than bringing reactants to the substrate, the substrate is brought to the reactants instead. In spatial ALD schemes that involve a plasma in the frame of the substrate, the plasma moves onto and over the substrate from a source that is non-moving and fixed in an inertial frame of reference. Such reactors leave the plasma on during substrate transfer, as each reaction zone in the special ALD reactor has its own RF power source. As this plasma front moves over the substrate, it can induce currents that can lead to device damage.

Spatial ALD systems also suffer in that deposited materials over the leading edge of the substrate, due to longer residence time under the plasma, may become thicker (e.g., tilt in the deposition layer) than the trailing edge of the substrate. Another problem is that the trailing edge can be exposed to the precursor and also byproducts. Still another drawback from such spatial ALD schemes is that internal feature deposition may be non-uniform, wherein inert feature sidewalls build-up with different thicknesses. In these systems, there is also a reported thickness variation that manifests itself in an asymmetric film thickness inside of features. And in some cases, film damage occurs. Film damage occurs due to excessive ion bombardment which may not be uniform across the wafer. The asymmetric profiles within the feature are more of an issue inboard to outboard in systems where the wafer is rotated about a remote center, circumscribing an arc. Despite best efforts to minimize damage and/or non-uniform deposition profiles, such spatial ALD schemes still suffer.

It is in this context that disclosures arise.

SUMMARY

Embodiments of the disclosure provide a spatial atomic layer deposition (ALD) system. The system includes a chamber that includes a plurality of zones oriented along a track. In some embodiments the track can be linear, and in other embodiments the track can be non-linear or circular. Included as part of the system is a shuttle that is configured to support the substrate and transport the substrate to each of the plurality of zones to enable deposition of a thin film. The shuttle includes an RF power electrode and an RF ground electrode coupled to an RF power source. The RF electrode and the RF ground electrode are each embedded in the shuttle, such that power provided by the RF power source to the shuttle moves with the shuttle to each of the zones. The RF power source is configured to be activated in synchronization with moving the shuttle to one of the zones.

In one embodiment, the plurality of zones includes at least a first zone for delivery of first reactant gases to be absorbed by a surface of a substrate when present, a second zone for purging the first reactant gases that are not absorbed by the surface of the substrate, and a third zone for delivery of second reactant gases to be reacted with the first reactant gases that were absorbed by the surface of the substrate.

In some embodiments, the shuttle is defined from a dielectric body, such that the embedded RF power electrode and the RF ground electrode are electrically isolated from each other.

In some embodiments, the RF ground electrode is defined in a center region of the shuttle and below support surface used to support the substrate when present and the RF power electrode is defined by at least one ring that surrounds the RF ground electrode.

In some embodiments, the chamber includes isolation surfaces disposed between each of the plurality of and each isolation surface is configured to protrude or extend as lower structure closer to a path to be traversed by the shuttle along the track.

In some embodiments, a height H1 between a top surface of the shuttle, disposed on the track, and a process zone upper surface of one of the zones is between about 6 mm-12 mm.

In some embodiments, a height H2 between a top surface of the shuttle, disposed on the track, and an isolation surface between respective zones is about less than 1 mm, and in some embodiments can be about 0.3 mm or less.

A spatial atomic layer deposition (ALD) system is provided. The system includes a chamber having a first zone for delivery of first reactant gases to be absorbed by a surface of a substrate when present, a second zone for purging the first reactant gases that are not absorbed by the surface of the substrate, and a third zone for delivery of second reactant gases to be reacted with the first reactant gases that were absorbed by the surface of the substrate. In some embodiments, a fourth zone is provided for purging after the processing of the second reactant gases. The system further includes a shuttle configured to support the substrate and transport the substrate to the first, second and third zones. If a fourth zone is provided, the shuttle can also transport to the fourth zone. The shuttle includes an RF power electrode and an RF ground electrode coupled to an RF power source. The system is also associated with a controller for synchronizing the RF power source to activate when the shuttle is moved to the third zone (i.e., the zone where the absorbed reactants are reacted by plasma energy to form a film). In this manner, the synchronization of activating of the RF power source enables generation of a plasma over a surface of the substrate when the second reactant gases are delivered to the third zone and the shuttle is located in the third zone.

In some embodiments, the shuttle is defined from a dielectric body, or portions of the shuttle are defined by dielectric structures.

In some embodiments, the chamber includes isolation surfaces disposed between the first zone and the second zone and between the second zone and the third zone, each isolation surface is configured to protrude closer to a path to be traversed by the shuttle along a track.

In some embodiments, each of the first, second and third process zones are disposed further (i.e., separated) from the path to be traversed by the shuttle along the track.

In some embodiments, the chamber includes isolation surfaces disposed between the first zone and the second zone and between the second zone and the third zone. Each isolation surface is configured to protrude closer (i.e., less separation for isolation) to a path to be traversed by the shuttle along a track.

In some embodiments, each isolation surface includes at least one input port and at least one output port, and said input ports are configured to supply an inert gas and said output ports are configured to remove inert gas and reactant gases between respective zones.

In accordance with the embodiments disclosed, by moving the RF power with the shuttle, deposition can be efficiently conducted in a spatial ALD arrangement without the drawbacks of leading edge thickness variations, trailing edge contamination and/or feature surface coverage thickness variations. In operation, each of the zones of the chamber can be active, and only the RF power source of the shuttle needs to be activated when the shuttle is disposed in the zone where plasma is needed for activating a reaction with absorbed reaction gases.

These and other advantages will be appreciated by those skilled in the art upon reading the entire specification and the claims.

BRIEF DESCRIPTION OF THE DRAWINGS

FIGS. 4A-4E illustrate further examples of shuttle movement and RF power delivery and synchronization, in accordance with one embodiment.

DESCRIPTION

Figure 1:
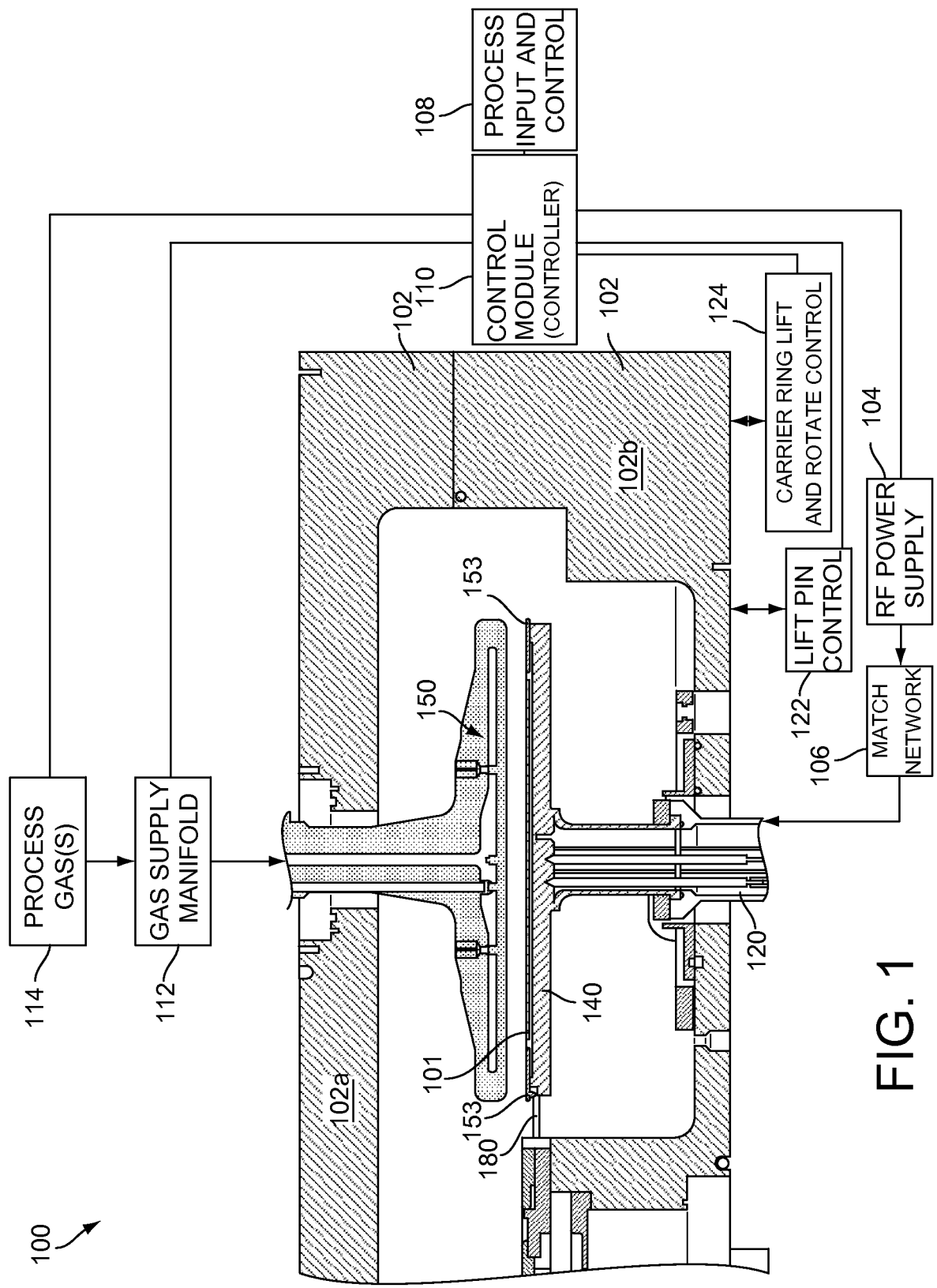
FIG. 1 illustrates a substrate processing system, which is used to process a substrate, e.g., to form films thereon.

Embodiments of the disclosure provide examples of atomic layer deposition (ALD) reactors that operate as spatial ALD reactors, wherein rather than bringing reactants to the substrate, the substrate is moved to the reactants instead. For example, in one spatial ALD configuration, the reactants are brought to the substrate (or vice versa) in space. The reactants and substrate need to move relative to each other. In one embodiment, the radio frequency (RF) excitation comes from the substrate side and moves with the substrate, eliminating moving plasma fronts that can cause current imbalances and device damage. In one embodiment, moving the substrate with the RF excitation can occur by translating the substrate linearly or rotating the substrate about an axis distal to the substrate center. In the examples provided herein, without limitation to other ways of moving the substrate and RF excitation, a shuttle that supports the substrate is linearly or circularly moved along a track. The shuttle has embedded electrodes that couple to an RF source, such that when the shuttle moves along the track, the RF excitation (e.g., at least one electrode of the excitation source) moves with the substrate. For example, having the at least one electrode move with the substrate enables positive power flow to enter the electrode under the substrate. In some embodiments, instead of using an RF excitation source, a direct current (DC) excitation source may be used. Thus, in general terms, the excitation source may be RF or DC.

As described below in more detail, in one embodiment, the RF source is activated depending upon the zone in which the shuttle is moved, so as to enable one or more ALD deposition steps. Reference may also be made to U.S. Pat. Nos. 6,428,859 and 6,627,268, which provide example structure and/or methods that may be used in some embodiments described herein. These patents are incorporated by reference herein.

In conventional temporal ALD reactors that employ a plasma (e.g., including activated reactant species e.g. ions and radicals), a plasma is struck approximately once per cycle. The plasma employed is usually a capacitively coupled plasma (CCP) that quickly goes from a nonexistent state to fully developed state very quickly everywhere on the substrate simultaneously. This transition event lasts only microseconds. No damage occurs from the plasma strike event (although some damage may occur from excessive ion energy in some implementations). As can be appreciated, the disclosed spatial ALD systems that employ an excitation source that moves with the substrate overcome many of the inherent damage issues and uniformities issues seen by prior art spatial ALD systems that employ a static plasma source.

In a spatial ALD system with plasma, the plasma is always on (during operation) in a spatially fixed location. In one embodiment, a system uses a filament discharge or triode type plasma arrangement. In one example, as the substrate passes underneath a zone, the transition event lasts on the order of 100 ms (milliseconds), significantly slower than in the conventional temporal method, and with a spatially moving front across the substrate. In addition, in some plasma source embodiments, this moving front can result in anode-cathode ratios that vary across the substrate.

In plasma systems, the anode-cathode ratio is very important in determining the energy of the impinging ions. To provide further technical understanding regarding these principles, reference may be made to a book entitled "*Glow Discharge Processes and Plasma Etching*", by Brian Chapman, John Wiley & Sons, 1980. Reference may also be made to a paper entitled "*Modeling for Rf Discharge Characteristics*", by S. Maniv, J. Appl. Phys. 63 (4), 15 Feb. 1988. This paper provides additional articulation regarding various voltage relationships based on differing assumptions in a derivation. Reference may additionally be made to a paper entitled "*Application of RF Discharges to Sputtering*", H. R. Koenig and L. I. Maissel, IBM J. Res. Dev. 14, 168 (1970). The above identified book and each of the identified papers are herein incorporated by reference.

For an asymmetric (meaning the effective area of one electrode is larger than the other) CCP discharge with a blocking capacitor, a ratio may be presented as noted in the below equation (1), where subscript 1 and 2 denote the effective cathode and anode respectively.

$$\frac{V_1}{V_2} = \left(\frac{A_2}{A_1}\right)^4 \text{ where } A_2 > A_1 \quad \text{(equation 1)}$$

For a constant plasma sheath voltage and hence constant ion energy under constant power conditions, the ratio of the areas need to be constant as indicated above. For a conventional spatial ALD system that incorporates round substrates such as wafers in combination with either translational motion along a line or an arc or rectangular substrates that circumscribe an arc and plasmas with constant power, this mathematical requirement cannot be true. Mathematically, if we choose a coordinate system θ, then as the substrate enters the plasma region exposing a portion of the substrate and moves an incremental amount, dθ, from that initial point, as represented by equation 2 below.

$$\left(\frac{V_1}{V_2}\right)' = \left(\frac{A_2 + dA_2}{A_1 + dA_1}\right)^4 \neq \left(\frac{A_2}{A_1}\right)^4 \quad \text{(equation 2)}$$

where $dA_1 = dr_1 d\theta$, $dA_2 = dr_2 d\theta$, and $dA_2 \neq dA_1$

In accordance with the disclosed spatial ALD system, these effects will be minimized since an electrode that provides the excitation source moves with the substrate.

In accordance with one embodiment, the plasma excitation source (e.g., at least one electrode of the plasma excitation source) moves with the moving substrate, e.g., with the shuttle. In one configuration, confined plasma conditions and an anode that is large relative to the substrate is provided. The plasma strike and extinction events, in one embodiment, are timed such that they occur only while under the anode structure. As such, movement of the substrate and striking of the plasma is synchronized. As a result, the benefits of temporal ALD CCP are maintained even in the aforementioned spatial ALD implementation. In addition, since the effective anode and cathode area are the portions or subset of the total area of the anode and cathode electrodes respectively, under this condition, the area ratios do not change over time as shown in equation 3 below.

$$\left(\frac{V_1}{V_2}\right)' = \left(\frac{A_2 + dA_2}{A_1 + dA_1}\right)^4 = \left(\frac{A_2}{A_1}\right)^4 = \frac{V_1}{V_2} \quad \text{(equation 3)}$$

where $dA_1 = 0$, $dA_2 = 0$, $\frac{d}{dt}A_1 = 0$, and $\frac{d}{dt}A_2 = 0$

Furthermore, in some implementations the transition event occurs over microseconds and the excitation source is simultaneously provided everywhere to the substrate.

FIG. 1 illustrates a substrate processing system 100, which may be used in a spatial based ALD system for processing a substrate 101. Although FIG. 1 is described in regard to temporal based ALD processing, it should be understood that a spatial ALD system can utilize some of the same or similar controls and system facilities, e.g., such as gas feeds, process gases, RF power sources, showerheads, etc. In the examples provided in accordance with this disclosure, however, the RF power source is provided to a shuttle that moves with the substrate. It should be understood, however, that the RF power source can be applied to either an anode or a cathode of a system.

Figure 2A:
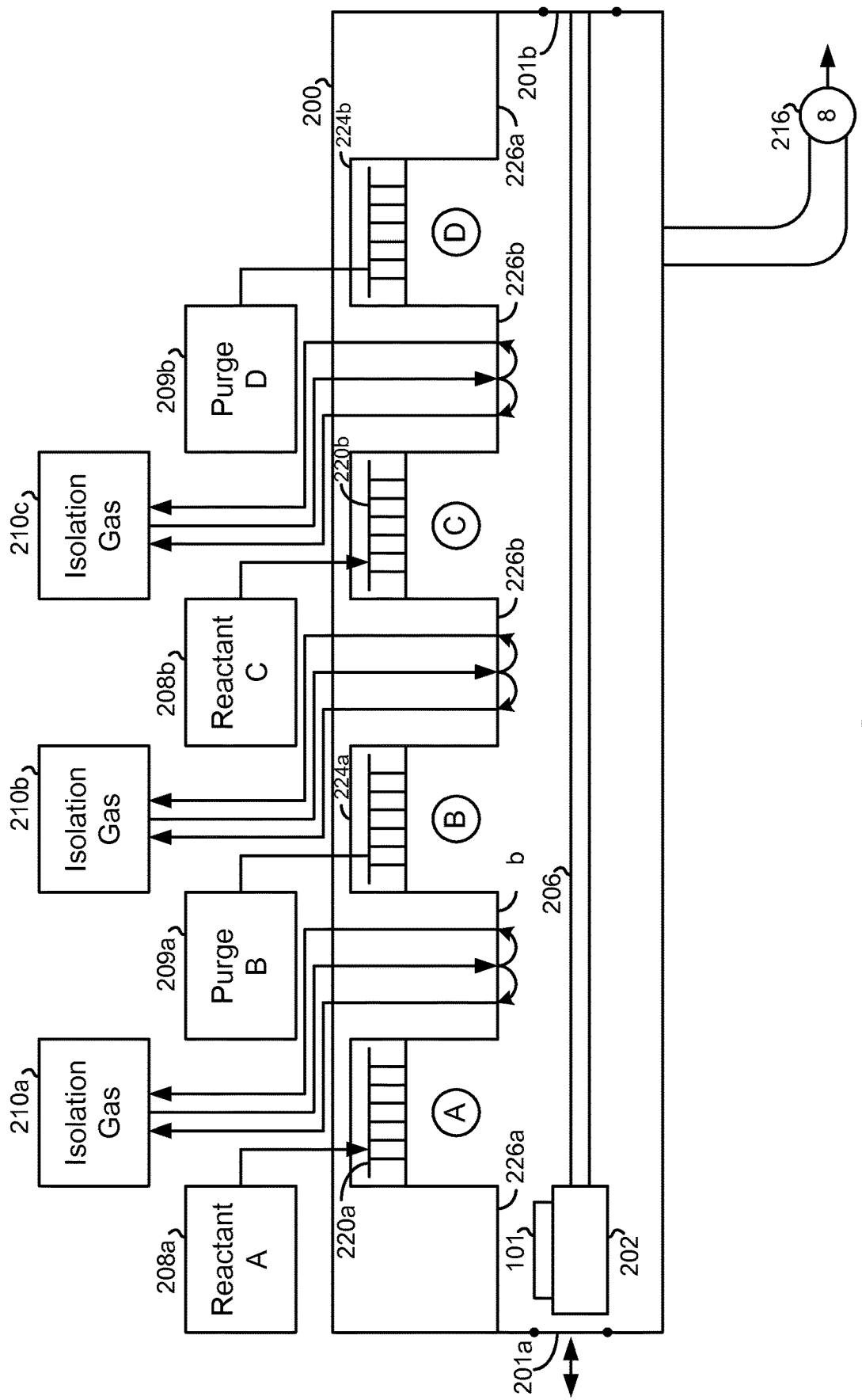
FIGS. 2A-2B illustrate example chamber configurations for a spatial ALD system, in accordance with one embodiment.

With this in mind, the system of FIG. 1 includes a chamber 102 having a lower chamber portion 102b and an upper chamber portion 102a. A center column is configured to support a pedestal 140, which in one embodiment is a powered electrode. The pedestal 140 is electrically coupled to power supply 104 (e.g., RF power source) via a match network 106. The power supply 104 may be defined from a single generator having two or more selectable and mutually exclusive oscillators. The power supply 104 is controlled by a control module 110, e.g., a controller. The control module 110 is configured to operate the substrate processing system 100 by executing process input and control 108. The process input and control 108 may include process recipes, such as power levels, timing parameters, shuttle speed, RF power levels, ground settings, process gasses, flow rates, mechanical movement of the substrate 101, etc., such for ALD film deposition over the substrate 101. The process input may, in some embodiments, provide the timing, speed, duration and motion control of the shuttle 202 (e.g., as shown in FIG. 2A), to enable spatial ALD processing with a moving RF source.

The center column is also shown to include lift pins 120, which are controlled by lift pin control 122. The lift pins 120 are used to raise the substrate 101 from the pedestal 140 to allow an end-effector to pick the substrate and to lower the substrate 101 after being placed by the end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flown into the shower head 150 and distributed in a space volume defined between the showerhead 150 face which faces that substrate 101 and the substrate 101 resting over the pedestal 140. In ALD processes, the gases can be reactants chosen for absorption (e.g., Reactant A of FIG. 2A) or reaction with absorbed reactants (e.g., Reactant C of FIG. 2A).

Further, the gases may be premixed or not. Appropriate valving and mass flow control mechanisms may be employed to ensure that the correct gases are delivered during the deposition and plasma treatment phases of the process. Process gases exit the chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 153 that encircles an outer region of the pedestal 140. The carrier ring 153 is configured to sit over a carrier ring support region that is a step down from a substrate support region in the center of the pedestal 140. The carrier ring includes an outer edge side of its disk structure, e.g., outer radius, and a substrate edge side of its disk structure, e.g., inner radius, that is closest to where the substrate 101 sits. The substrate edge side of the carrier ring includes a plurality of contact support structures which are configured to lift the substrate 101 when the carrier ring 153 is lifted by forks 180. The carrier ring 153 is therefore lifted along with the substrate 101 and can be rotated to another station, e.g., in a multi-station system. In other embodiments, the chamber is a single station chamber. In still other embodiments, the chamber is part of a spatial ALD chamber 200 (shown in FIG. 2A, for example), which includes a shuttle 202 and an edge ring 204. The edge ring may also be referred to as a focus ring, depending on the implementation.

As shown, RF power is supplied to an electrode of the chamber so that a plasma can be generated for deposition. In the spatial ALD chamber 200, the RF power source is coupled to the shuttle 202, which moves the substrate from process zone to process zone to complete one or more film deposition steps.

More detail regarding the spatial ALD system with a movable RF excitation is provided below with reference to FIGS. 2A-7D.

FIG. 2A illustrates an example spatial ALD system, in accordance with one embodiment. The spatial ALD system includes a chamber 200 that has a plurality of zones for processing the substrate 101. The substrate 101 is supported by a shuttle 202, and the shuttle 202 is configured to transport or move the substrate 101 to each of the zones A-D. In one embodiment, substrates are introduced into the chamber 200 via an access port 201a. In some embodiments, an access port 201b is also provided at the end near zone D. Substrates are introduced into the chamber 200 via a load port, which may be interfaced with the access ports. The chamber 200 is, in one embodiment, under vacuum, so the load port assists in transferring substrates into and out of the chamber 200. In one embodiment, the chamber 200 may be configured to operate at pressures in the range of 8-100 Torr, which is higher than temporal systems. As shown, a pump 216 may also be included as part of the chamber 200, which may assist in removing gas flows, pumping the chamber to desired pressures, or to enable service operations.

In other embodiments, chamber 200 may be clustered with other chambers or tools, to define a larger architecture system. In some embodiments, fewer zones are provided, such as only providing zones A-C. In general, zone A is configured to provide a reactant gas 208a, and distribute the reactant gas 208a over the zone A, such that the reactant gas 208a is quickly absorbed over a surface or layer disposed on the substrate 101. In some embodiments, zone B is not required, and a system may omit processing or structures associated with zone B. In such cases, the process my progress from zone A (application of reactant A) to zone C (application of reactant C).

A showerhead 220a is provided in zone A, and is used to provide and distribute the reactant gas 208a. In operation, the shuttle 202 will move the substrate 101 to a location that is under the showerhead 208a of zone A. Once the gases have been absorbed from reactant gases 208a, the shuttle moves the substrate 101 toward zone B. Between zone A and zone B, an isolation surface 226b is provided. Opposite isolation surface 226b is isolation surface 226a. Between the isolation surfaces, which represent lowered structural surfaces or body of the upper chamber 200, the zone A is defined. Each of the other zones B, C and D are respectively disposed between isolation surfaces 226. Isolation surfaces 226b, for example, also include a plurality of inlet ports and outlet ports. The inlet ports are configured to provide an inert gas and the outlet ports are configured to remove the inert gas and other gas byproducts, such as to provide an isolation between the zones.

In the illustrated embodiment, the shuttle will pass under isolation surface 226b on its way to zone B, wherein a purge 209a process is performed by a purge head 224a and other gas pumping equipment near or around zone B. The purge process is configured to evacuate reactants that may be disposed over or around the zone B or over the substrate when present in zone B, i.e., when moved to zone B by the shuttle 202. In one example, the operation in zone B may take between 20 and 300 ms, depending on the recipe being processed. Next, the shuttle 202 is moved to zone C, while passing under isolation surface 226b. As noted above, isolation surface 226b is controlled by isolation gas and the input ports and outlet ports that are in communication with isolation gas 210b. Isolation gas 210a-210c, for example, are configured to provide inert gas to the input ports of the isolation surface 226b, and remove inert gas and byproducts of the reacting gases, which may be disposed or routed to other exhaust infrastructure.

Once the shuttle 202 is moved to zone C, the system controller 110 is configured to activate the RF power source 240 that delivers power to the RF electrodes embedded in the shuttle 202. As described below in more detail, the electrodes embedded in the shuttle include an RF power electrode and an RF ground electrode. In this manner, the controller 110 can activate the power source to deliver RF power to the electrodes of the shuttle 202 when the shuttle has reached zone C of the chamber 200. In one embodiment, the RF power provided by the electrodes of the shuttle 202 can range between 75 watts and 1000 watts, and in another embodiment between 250 watts and 300 watts. The power setting provided during operation, which may fall between the above noted ranges, will depend upon the process recipe being implemented in the spatial ALD system. Further, processing in zone C may range between about 25 ms to about 3 seconds, on average, depending on the recipe. Again, this duration is based on the target process, the material types, the thicknesses desired from the ALD step, and other variables.

In zone C, the RF power provided to the shuttle 202, having the substrate 101 disposed thereon, will produce a plasma over the surface of the substrate 101. The space in and around zone C is preferably filled with gas from reactant 208b, which will be activated over the surface of the substrate 101 when the power is set to be activated. In one embodiment, the power is set to be activated in a synchronous manner, such that when the substrate 101 reaches an area under zone C, the RF power is activated. In one embodiment, the reactant 208b is chosen such that a reaction will occur between the reactant 208b delivered by a showerhead 220b and the reactant 208a that was absorbed by the substrate in zone A. In one configuration, the shuttle 202 has been moved to zone D, where a purge 209b process is performed, similar to the operation performed in zone B. In zone D, the operation may last, depending on the desired recipe, between about 20 and 150 ms, and in some cases, between about zero and 300 ms.

Figure 2B:
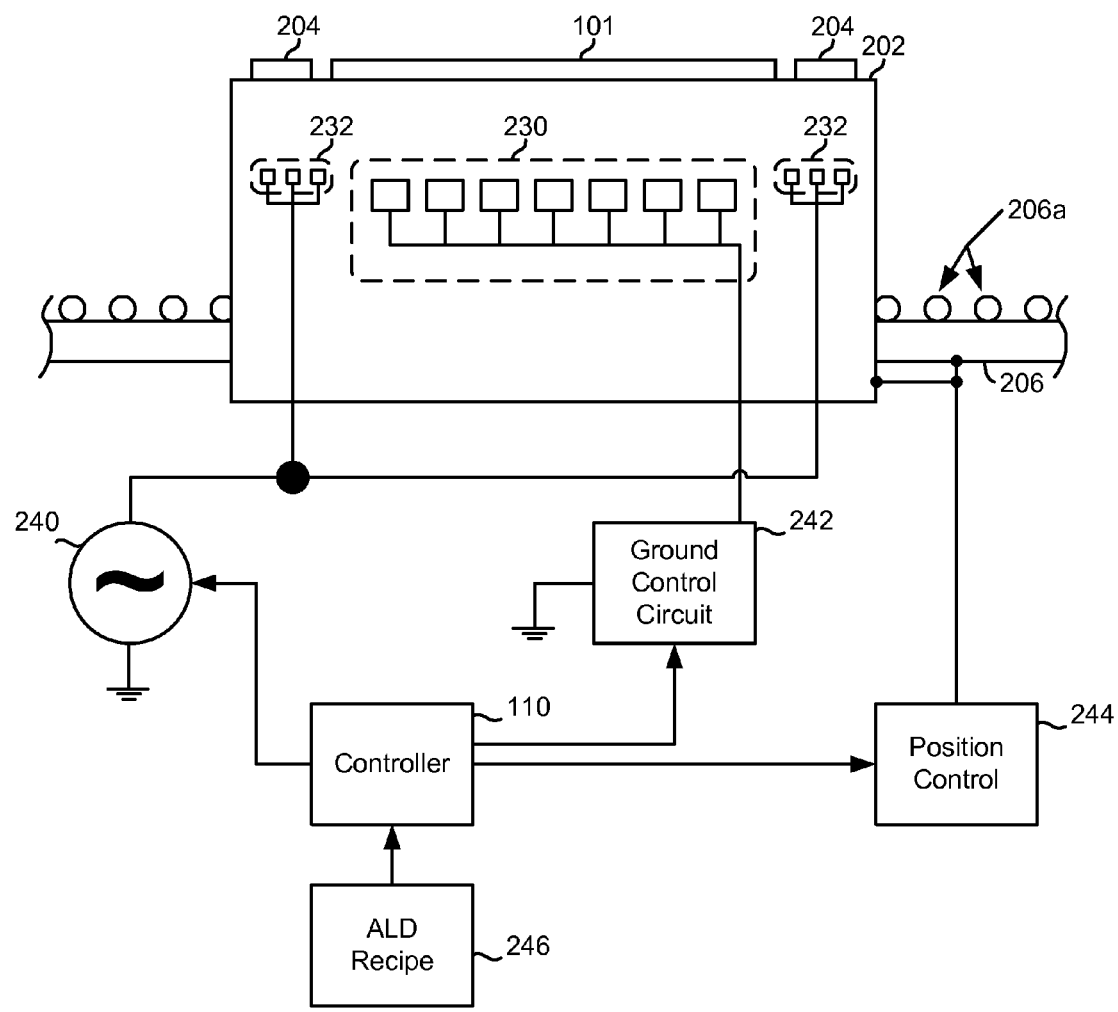

FIG. 2B illustrates an example of the shuttle 202, in accordance with one embodiment. Shuttle 202 is preferably defined from a dielectric material. In some embodiments, parts of the shuttle 202 may be defined from non-dielectric materials, such as support materials that interface with a track 206. In general, at least a portion of the shuttle 202 that contains or surrounds the embedded RF ground electrode 230 and the RF power electrode 232 will be defined from a dielectric material. In some embodiments, the shuttle 202 may be defined from a multilayered structure. In another embodiment, the shuttle 202 may be defined from a single dielectric block that is formed with embedded electrodes. In still other embodiments, multiple sections of the shuttle 202 may be provided, such that the RF ground electrode 230 and the RF power electrode 232 are separately interconnected to form the shuttle 202.

As illustrated, the RF ground electrode 230 can be defined from a plurality of interconnected ground segments. The various segments can be arranged in a circular manner so that a center of the shuttle 202 below the substrate 101 will have the segments that define the RF ground electrode 230. In some embodiments, the RF ground electrode 230 may be defined by a single ground material, e.g., a metallic or electrically conductive disk or coil. In still other embodiments, the RF ground electrode 230 can be defined by circular concentric rings that define radial segments. In further embodiments, the RF ground electrode 230 can be connected to a ground control circuit 242. In some implementations, the ground control circuit is simply connected to ground so that each one of the segments in the RF ground electrode 230 sees the same ground potential. In other embodiments, the ground control circuit 242 can be programmed by the controller 110 so that different regions or segments of the RF ground electrode 230 are coupled to different voltages that are different from ground or some of the segments are coupled to ground and some segments are electrically floating.

RF power source 240 is configured to provide power to the RF power electrode 232 of the shuttle 202. As illustrated in FIG. 2B, the RF power electrode 232 can be defined by a single ring or a plurality of rings or segments. In other embodiments, the RF power electrode 232 is defined by a single conductive element that is disposed substantially under an edge ring 204. As will be illustrated in more detail below, when power is provided to the RF power electrode 232, power is symmetrically returned to the RF ground electrode 230. The resulting RF power excitation provided by the shuttle 202 is imparted to the reactants that may be present in the zone in which a plasma is to be generated as part of the spatial ALD process. As further illustrated, the track 206 may include a plurality of air bearings, which assist the shuttle 202 to glide or move between the various zones in response to position control 244. In some embodiments, the track may be a belt and pulley track, a pneumatic controlled track, a geared track, or a tape controlled track. The configuration of the track may vary, so long as the shuttle can be moved to the zones in an efficient manner and particle generation reduced or managed.

Position control 244 will receive position information from the controller 110. Based on an ALD recipe 246, the controller can synchronize positioning of the shuttle 202 in a specific zone and activation of the RF power source 240. In chamber 200, each of the zones A-D, in one embodiment, are always on. The shuttle 202, however, will not be providing RF power to the embedded RF electrodes until the shuttle 202 reaches the zone in which a plasma reaction is required. As such, the spatial ALD system of FIG. 2A can be referred to as a single step operation with four separate zones. The system is a single step operation because each of the zones are continuously on, performing a single step. From the substrate's perspective, the substrate will see four different steps as it progresses through each of the zones of the chamber 200. In contrast with temporal based ALD systems, where a single chamber is used to perform multiple steps, in the spatial ALD system of FIG. 2B, each zone will only perform a single step.

Figures 3A, 3B:
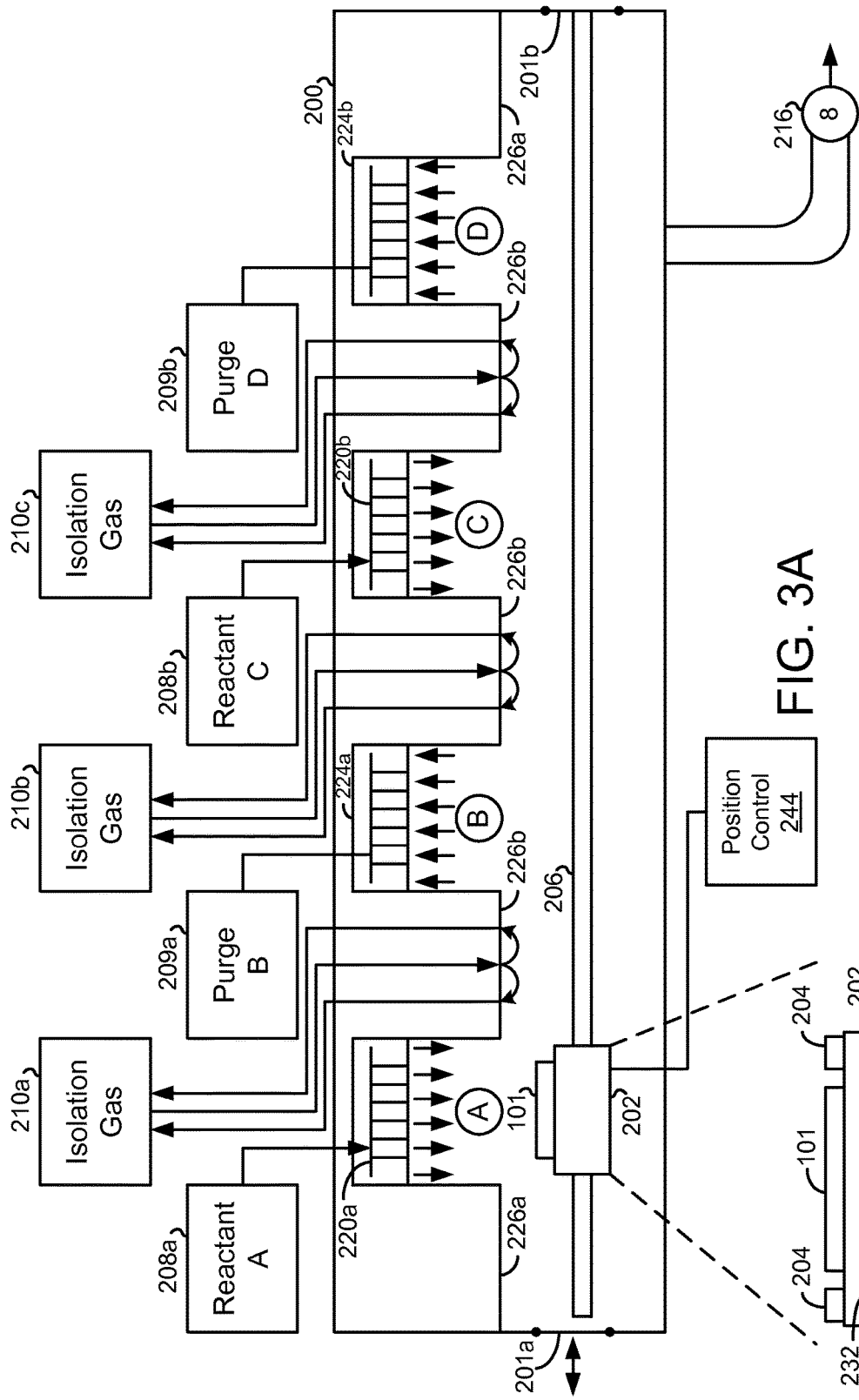
FIGS. 3A-3B illustrate examples of a shuttle used to move a substrate within the chamber, in accordance with one embodiment.

FIG. 3A illustrates the chamber 200 of FIG. 2A, where position control 244 has moved the shuttle 202 under zone A. In this configuration, the shuttle 202 will remain with its RF power 240 off. Processing in zone A, for example, will allow reactant gases 208a to absorb into a layer or materials of the substrate 101. In one embodiment, absorption time can last between 30 and 50 ms, and in some embodiments can be up to a few seconds depending on the process parameters and the materials being deposited. For example, if absorption is expedited, the duration of absorption can be reduced which would enable position control 244 to move shuttle 202 to the next zone along track 206. As shown in FIG. 3B, the shuttle 202 will include the RF ground electrode 230 (shown as a single conductor) and the RF power electrode 232 (shown as a single annular ring conductor).

As noted above, the construction of the conductors used for the RF power electrode 232 and the RF ground electrode 230 can vary. In some embodiments, the conductive material can be' made from aluminum or a tungsten/aluminum. Of course, other conductors can also be used. Further shown is the edge ring 204 that is disposed over a surface of the shuttle 202 and surrounding the location where the substrate 101 will be disposed during operation. In one configuration, the edge ring is made from alumina. In another embodiment, the edge ring may be made from aluminum nitride.

Figures 4A, 4B:
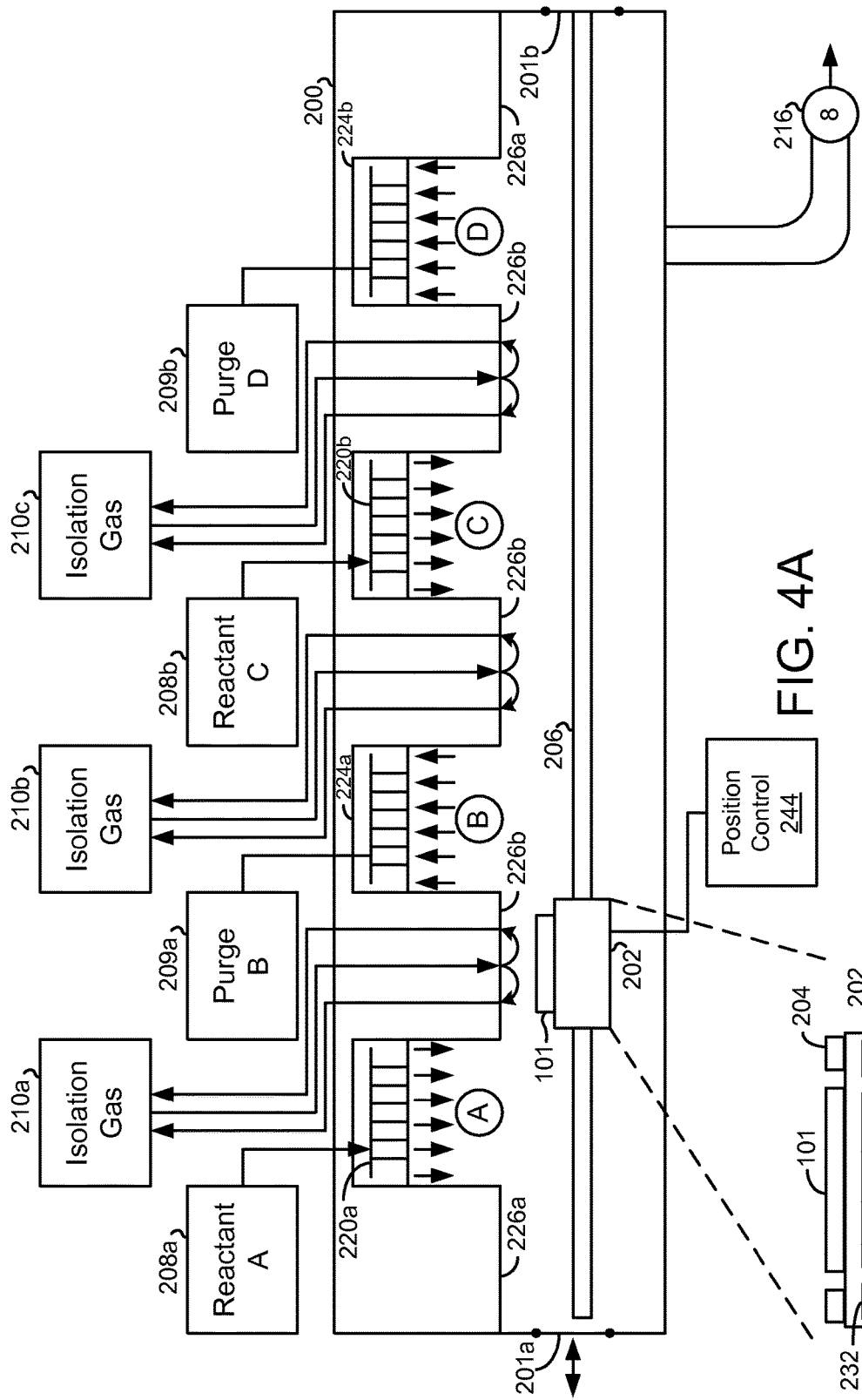

FIG. 4A illustrates the chamber 200 of FIG. 2A where position control 244 has moved the shuttle 202 under isolation surface 226b, when in route to zone B. While the shuttle moves the substrate between zones, the isolation surface 226b, which is disposed closer to the surface of the substrate 101 and shuttle 202, will act to isolate processing operations in the respective zones.

FIG. 4C illustrates the chamber 200 of FIG. 2A where position control 244 has moved shuttle 202 under zone C. When the shuttle 202 has been placed under zone C, the controller 110 will synchronize activation of the power source 240 to deliver power to the RF power electrode 232 and the RF ground electrode 230. As mentioned above, the flow of reactants 208a and 208b will continuously flow in each of zones A and B, and the purge 209a/b process in zones B and D will also continuously operate. However, the delivery of RF power to the shuttle 202 and its electrodes will only be triggered upon having the shuttle arrive at zone C. It should be understood that if plasma is desired in other zones or if the process configurations change, the controller 110 can operate to activate the delivery of RF power to the shuttle 202 when the shuttle is present or disposed under different zones.

FIG. 4D illustrates an example of RF power 240 being delivered to the RF power electrode 232 and a return of RF power to the RF ground electrode 230. This flow of RF power provides the necessary excitation power to create plasma from reacting gases flown into zone C, during the ALD deposition process.

Figure 4E:
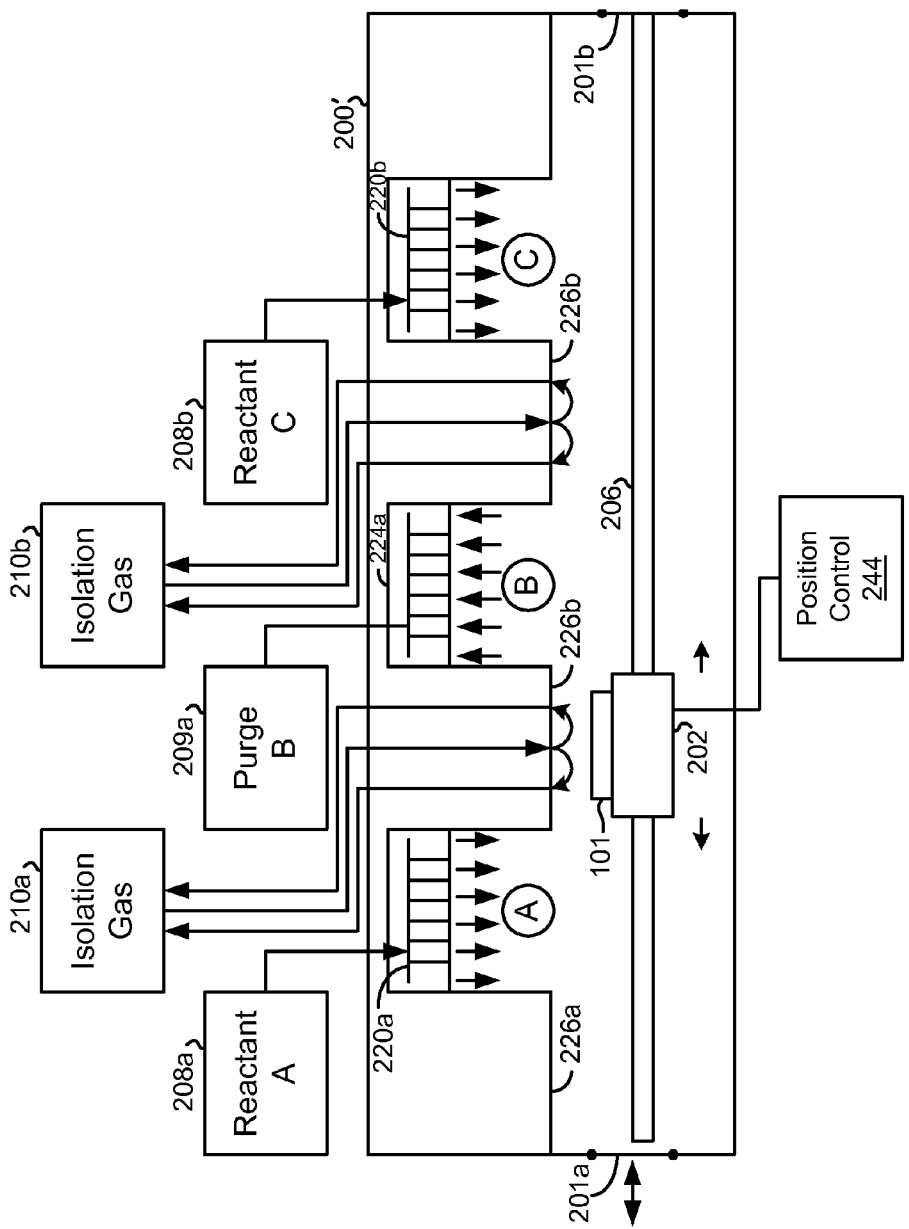

FIG. 4E illustrates another embodiment where only zones A-C are used as part of chamber 200'. In this configuration, position control 244 will move shuttle 202 to the various zones A-C, and also traverse the shuttle 202 under the isolation surfaces 226b, to maintain isolation between the zones. This illustration has been provided to illustrate that an ALD deposition process can also operate where the shuttle 202 sequentially moves between A→B→C→B and then repeat A→B→C→B as many times as needed to define the target thickness of the layer or film being deposited.

Figure 5:
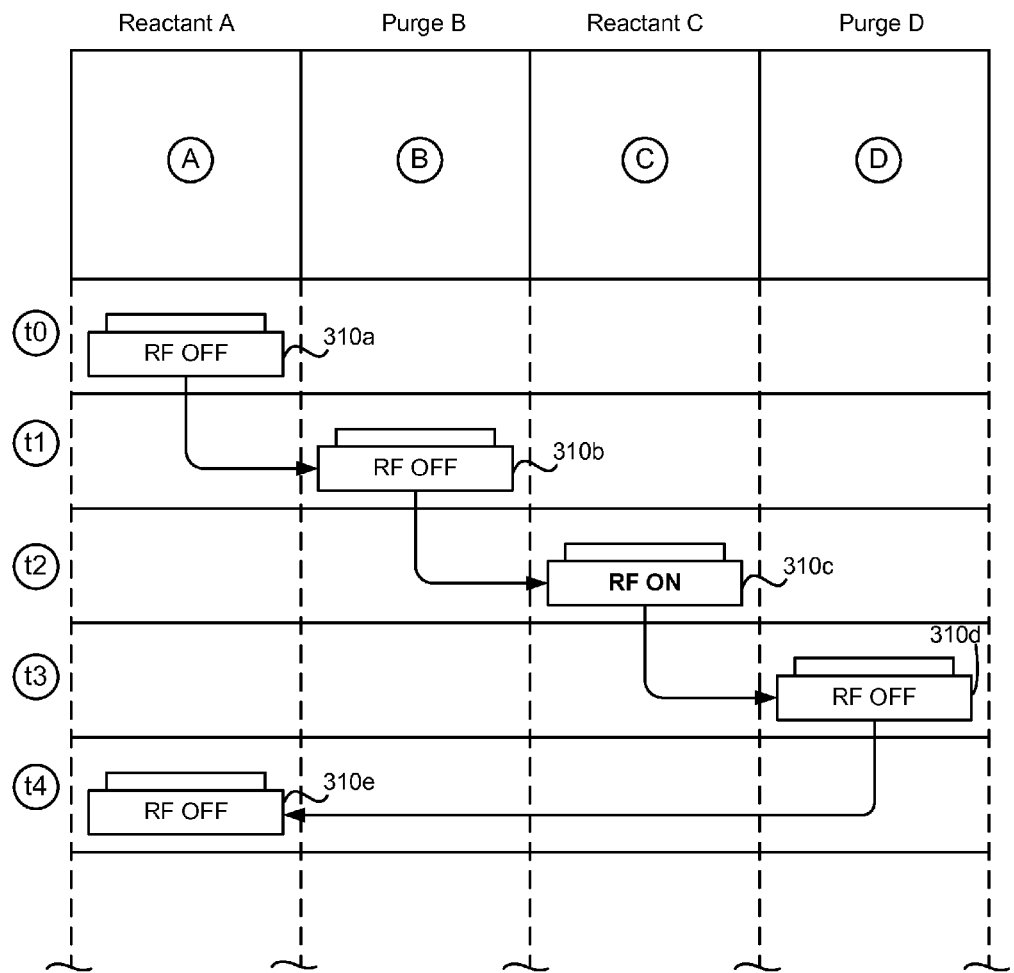
FIGS. 5 and 6 illustrate progression operations used by the shuttle in deposition operations, in accordance with the spatial ALD system.

FIG. 5 illustrates a process progression through zones A-D, wherein a film is deposited each time the shuttle completes the progression through zones A-D. In this example, the shuttle is placed in position 310a when in zone A, placed in position 310b when in zone B, placed in position 310c when in zone C, placed in position 310d when in zone D, and placed in position 310e when in zone A. In this implementation, the shuttle needs to return from zone D to zone A to repeat the process, e.g. to form another film during the ALD deposition.

Figure 6:
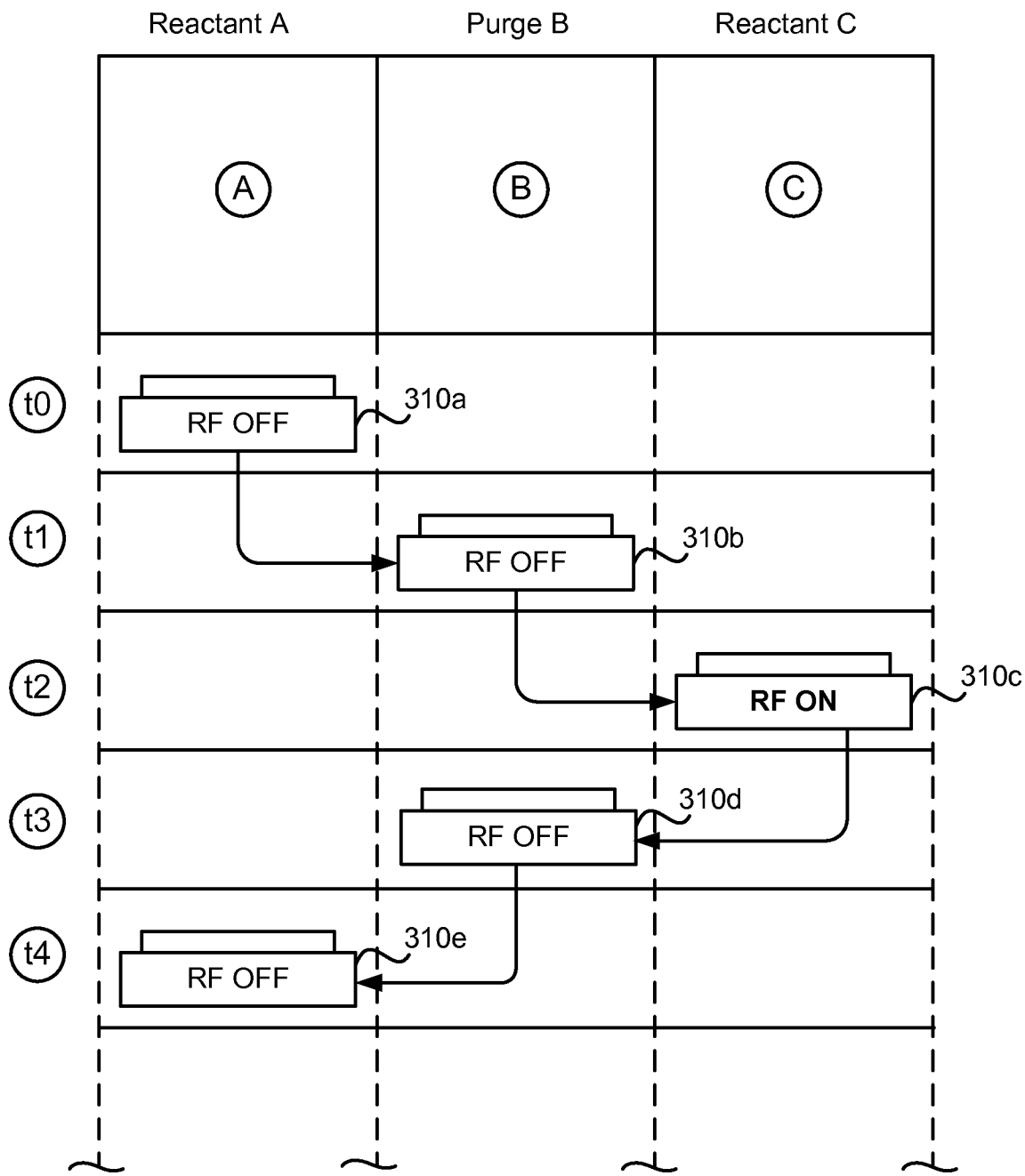

FIG. 6 illustrates a process progression through zones A-C, wherein a film is deposited each time the shuttle progresses through zones A, B, C, and B. Since B is a purge 209 process, this purge 209 process can be reused along the path going both ways. And, since zone A is the start of a next progression, the film deposition can immediately restart. In one implementation, the process progression of FIG. 6 provides for more efficiencies over the process progression of FIG. 5. In some implementations, it may be desired to use the process progression of FIG. 5 so that each zone can provide a separate purge process. By separately providing purge processes as shown in FIG. 5, it is possible to isolate reactants or contaminants for film deposition operations that require more precision.

Figure 7A:
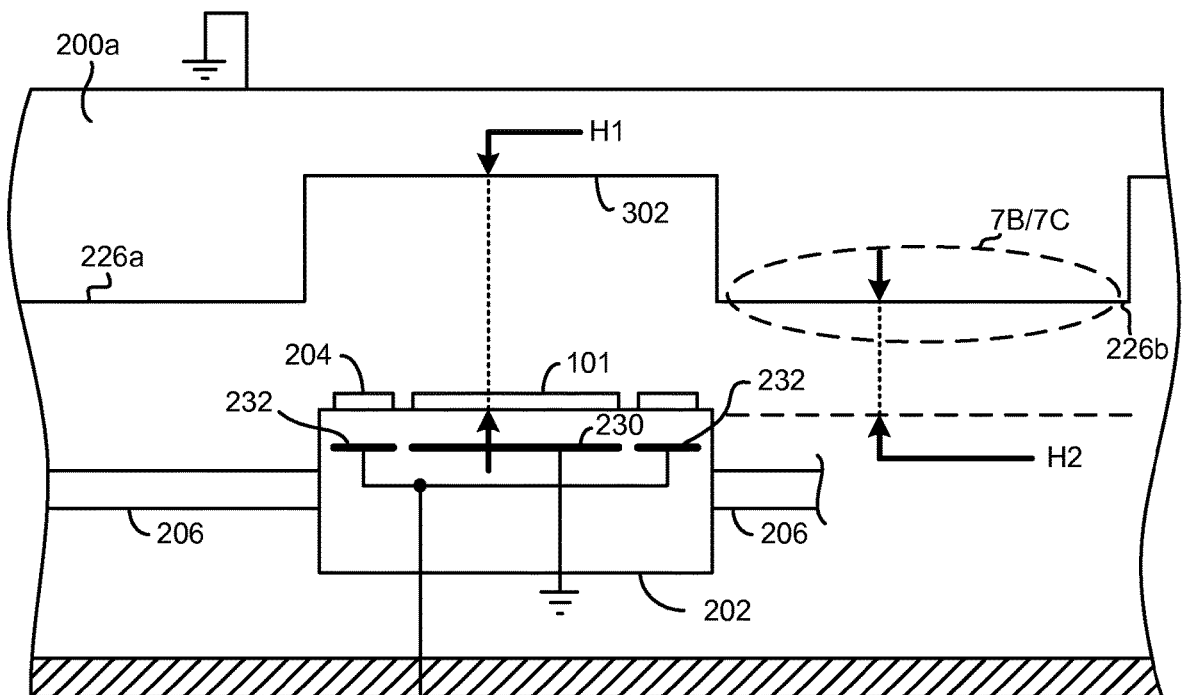
FIG. 7A-7C illustrate example structural features of a chamber in accordance with one embodiment.

FIG. 7A illustrates a more detailed diagram of part of chamber 200, as represented by chamber segment 200a. In this example, a separation or height between the top surface of the shuttle 202 and a process zone upper surface 302 may be larger than a separation or height between a top surface of the shuttle 202 and an isolation surface 226b. As shown, the process zone upper surface 302 may be the surface where showerhead 220 or purge head 224 are positioned within the respective zones. In general, by having a larger separation between the top surface of the shuttle 202 and the process zone upper surface 302, it is possible to define a space or compartment in which process gases can be supplied and substantially confined or isolated.

Further, by having a smaller space or separation between the isolation surface 226b and the top surface of the shuttle 202, it is possible to further assist in isolation of the zones by supplying an inert gas and removing an inert gas. In one embodiment, the height H1 can be between about 6 mm and 12 mm, and in another embodiment, between about 6 and 7 mm. In still another embodiment, the height H2 can be about less than 1 mm, and in another embodiment, between about 0.1 and 0.3 mm.

Figure 7B:
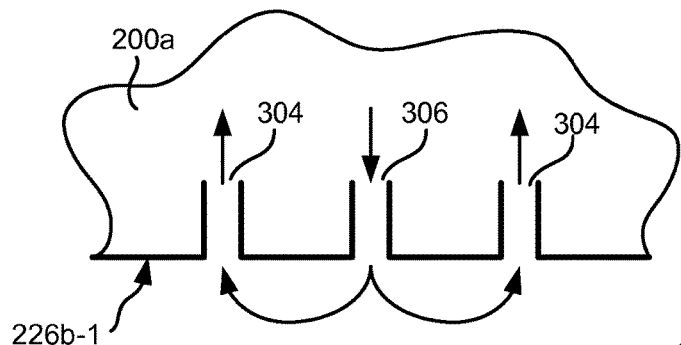

FIG. 7B illustrates an example of input ports 306 used for delivering gases to the region between the isolation surface 226b and the upper surface of the shuttle or substrate when present. Additionally, a plurality of output ports 304 can be used to remove inert gases and byproducts from the processing performed in respective zones adjacent to the isolation surfaces 226b. The input ports 306 and output ports 304 are, in one embodiment, formed through a surface 226b-1 of the upper chamber body or sub-assembly.

Figure 7C:
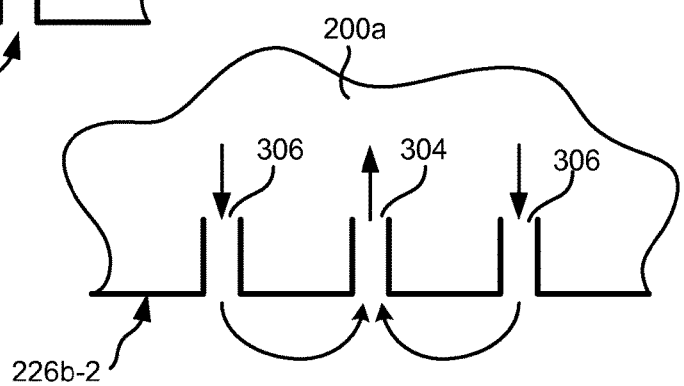

FIG. 7C illustrates another embodiment where input ports 306 surround the output ports 304. The input ports 306 and output ports 304 are, in this embodiment, formed through a surface 226b-2 of the upper chamber body or sub-assembly. Accordingly, it should be understood that any number of configurations for input ports and outlet ports may be possible so long as a sufficient flow and evacuation of gases can be maintained to a suitable level so that substantial isolation can be maintained between the zones in the chamber 200.

Figure 7D:
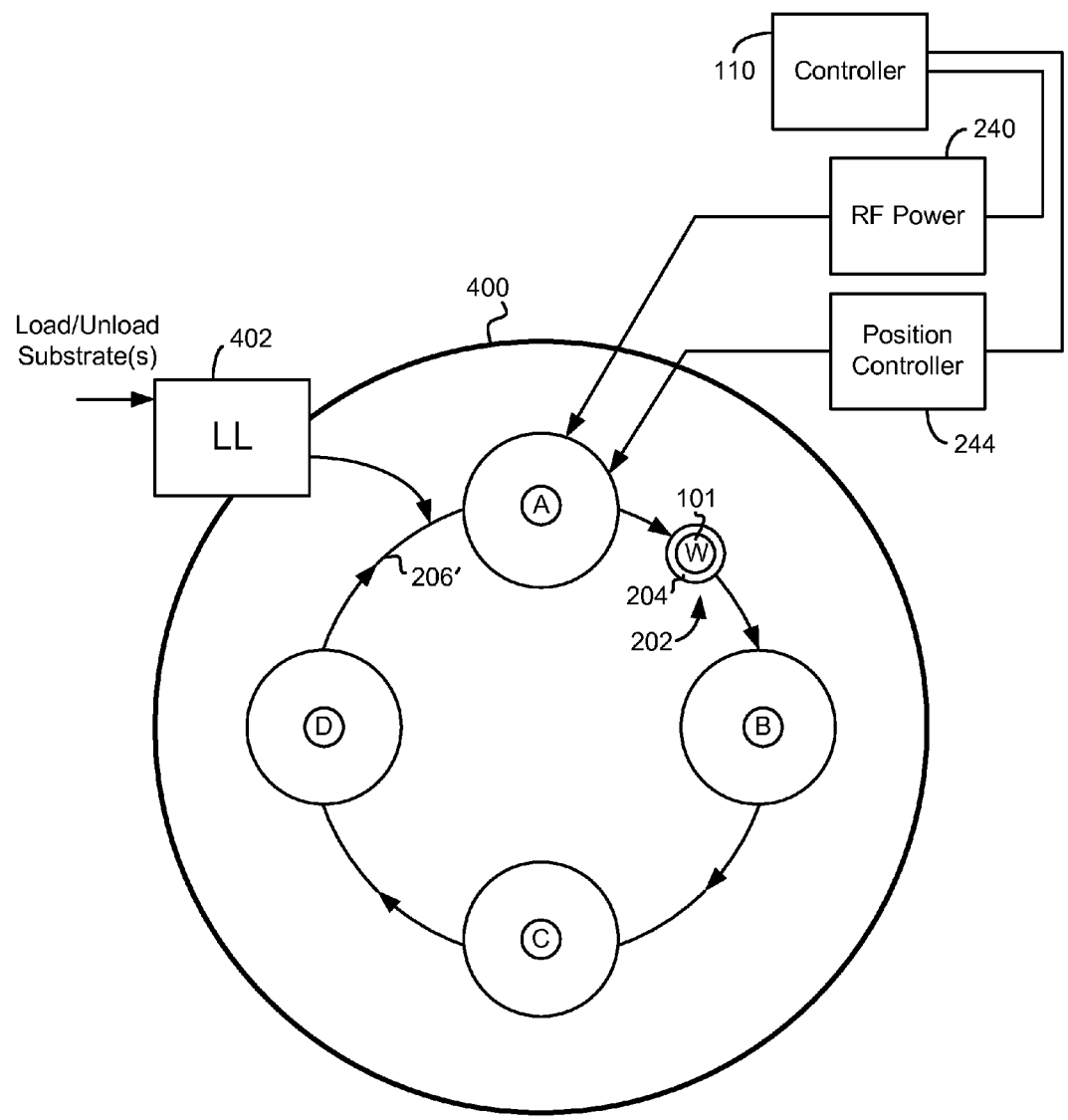
FIG. 7D illustrates an alternate example of the chamber, which utilizes a circular or non-linear track to move the shuttle along process zones to complete one or more ALD film deposition operations.

FIG. 7D illustrates an example where zones A-D are arranged in a circular path, in accordance with one embodiment of the present disclosure. The circular path is defined by a track 206', which allows movement of the shuttle 202 having a substrate 101 between the zones A-D. In one embodiment, substrates are provided to a loadlock (LL) 402 to enable loading and unloading of substrates to the spatial ALD 400. As shown, the controller 110 can be in communication with RF power 240 and position control 244. Position control 244 can move the shuttle 202 between the zones, and once the shuttle 202 is disposed in one of the zones where RF power is to be supplied, the controller 110 will synchronize activation of the RF power to the shuttle 202. In one embodiment, the spatial ALD system 400 will have all of the zones operating, and the shuttle 202 will move the substrate 101 to the respective zones to process an ALD deposition operation. Once the shuttle 202 is placed in the zone that requires plasma generation, the controller 110 will activate delivery of RF power to the shuttle 202.

Depending upon the thickness of the material being deposited over the substrate 101, any number of rotations around the circular arrangement of system 400 can take place. In some embodiments, the arrangement can be disposed in many different configurations that need not be perfectly circular. For example, the track can be oval, they can have multiple turns, they could be arranged in a track with multiple segments and multiple lengths. Further, additional processing zones can be added along the track or removed from the track depending on the system configuration, process parameters, and recipes being executed through the spatial ALD system.

Figure 8:
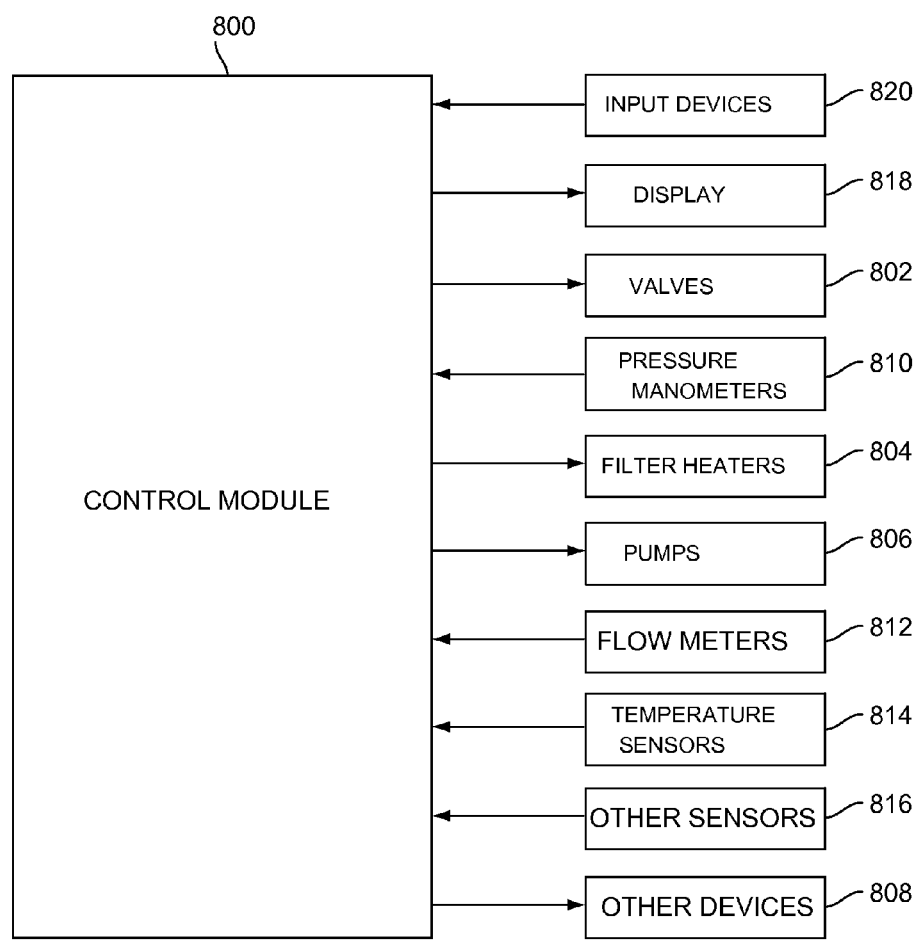
FIG. 8 shows a control module for controlling the systems, in accordance with one embodiment.

FIG. 8 shows a control module 800 for controlling the systems described above. In one embodiment, the control module 110 of FIG. 1 may include some of the example components. For instance, the control module 800 may include a processor, memory and one or more interfaces. The control module 800 may be employed to control devices in the system based in part on sensed values. For example only, the control module 800 may control one or more of valves 802, filter heaters 804, pumps 806, and other devices 808 based on the sensed values and other control parameters. The control module 800 receives the sensed values from, for example only, pressure manometers 810, flow meters 812, temperature sensors 814, and/or other sensors 816. The control module 800 may also be employed to control process conditions during precursor delivery and deposition of the film. The control module 800 will typically include one or more memory devices and one or more processors.

The control module 800 may control activities of the precursor delivery system and deposition apparatus. The control module 800 executes computer programs including sets of instructions for controlling process timing, delivery system temperature, pressure differentials across the filters, valve positions, mixture of gases, chamber pressure, chamber temperature, substrate temperature, RF power levels, substrate chuck or pedestal position, and other parameters of a particular process. The control module 800 may also monitor the pressure differential and automatically switch vapor precursor delivery from one or more paths to one or more other paths. Other computer programs stored on memory devices associated with the control module 800 may be employed in some embodiments.

Typically there will be a user interface associated with the control module 800. The user interface may include a display 818 (e.g. a display screen and/or graphical software displays of the apparatus and/or process conditions), and user input devices 820 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the substrate chuck.

Examples of sensors that may be monitored during deposition include, but are not limited to, mass flow control modules, pressure sensors such as the pressure manometers 810, and thermocouples located in delivery system, the pedestal or chuck (e.g. the temperature sensors 814). Appropriately programmed feedback and control algorithms may be used with data from these sensors to maintain desired process conditions. The foregoing describes implementation of embodiments of the disclosure in a single or multichamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A spatial atomic layer deposition (ALD) system, comprising,
    a chamber that includes,
        a first zone for delivery of first reactant gases to be absorbed by a surface of a substrate when present;
        a second zone for purging the first reactant gases that are not absorbed by the surface of the substrate;
        a third zone for delivery of second reactant gases to be reacted with the first reactant gases that were absorbed by the surface of the substrate, and isolation surfaces are disposed between the first zone and second zone and between the second zone and the third zone, and each isolation surface has an input port to deliver inert gas and an output port to remove the inert gas and reactant gases;
    a shuttle configured to support the substrate and move the substrate on the shuttle along a linear track to transport and move the substrate through the first, second and third zones for a single deposition step, wherein the shuttle includes an RF power electrode and an RF ground electrode coupled to an RF power source; and
    a controller for synchronizing the RF power source to activate when the shuttle is moved to the third zone, wherein activating the RF power source enables generation of a plasma over a surface of the substrate when the second reactant gases are delivered to the third zone and the shuttle is located in the third zone, wherein the shuttle is made from a dielectric body that provides electrical isolation and the RF ground electrode is located in a center region of the shuttle and below a support surface used to support the substrate when present, and the RF power electrode is a ring that surrounds the RF ground electrode,
    wherein that said plasma is generated, when in the third zone, over the surface of substrate via excitation power provided by a flow of power from the ring to the RF ground electrode.

2. The spatial ALD system of claim 1,
    wherein the RF power electrode is a first electrode of the shuttle and the RF ground electrode is a second electrode of the shuttle, and a separation between each isolation surface and the substrate on the shuttle is less than about 1 mm.

3. The spatial ALD system of claim 1, wherein a height H1 between a top surface of the shuttle, disposed on the linear track, and a process zone upper surface of the first, second or third zones is between about 6 mm-12 mm.

4. The spatial ALD system of claim 1, further comprising,
    a showerhead integrated as part of an upper surface of the first and third zones, the showerheads configured to respectively supply the first and second reactants;
    a purge head integrated as part of an upper surface of the second zone, the purge head configured to pump out at least part of the first reactants before enabling the shuttle to move to the third zone after leaving the first zone.

5. The spatial ALD system of claim 1, wherein the RF ground electrode is coupled to ground via a ground control circuit, wherein the ground control circuit enables setting of ground to one or more ground electrode elements of the RF ground electrode that is integrated into the shuttle, the dielectric body is a ceramic material and the RF ground electrode is embedded in the ceramic material of the shuttle.

6. The spatial ALD system of claim 1, further comprising,
    position control for directing position of the shuttle when moved between the zones of the chamber.

7. The spatial ALD system of claim 1, wherein the linear track is one of an air bearing track, a belt and pulley track, a pneumatic controlled track, a geared track, or a tape controlled track.

8. A spatial atomic layer deposition (ALD) system, comprising,
    a chamber that includes a plurality of zones oriented along a linear track;
    isolation surfaces being disposed between the plurality of zones, and each isolation surface has an input port to deliver inert gas and an output port to remove the inert gas and reactant gases;
    a shuttle configured to support the substrate and move the substrate on the shuttle along the linear track to transport the substrate through each of the plurality of zones to enable deposition of a thin film, and the shuttle includes an RF power electrode and an RF ground electrode coupled to an RF power source, the RF electrode and the RF ground electrode are each embedded in the shuttle, such that power provided by the RF power source to the shuttle moves with the shuttle through each of the zones for a single deposition step, the RF power source is configured to be activated in synchronization with moving the shuttle to one of the zones;
    wherein the shuttle is formed from a dielectric body, such that the embedded RF power electrode and the RF ground electrode are electrically isolated from each other, and the RF ground electrode is located in a center region of the shuttle and below support surface used to support the substrate when present, and the RF power electrode is at least one ring that surrounds the RF ground electrode;
    wherein a plasma is generated when the RF power is activated to form said plasma over a surface of the substrate via excitation power provided by a flow of power from the at least one ring to the RF ground electrode.

9. The spatial ALD system of claim 8, wherein the plurality of zones includes at least a first zone for delivery of first reactant gases to be absorbed by a surface of a substrate when present, a second zone for purging the first reactant gases that are not absorbed by the surface of the substrate, and a third zone for delivery of second reactant gases to be reacted with the first reactant gases that were absorbed by the surface of the substrate.

10. The spatial ALD system of claim 8, wherein a height H1 between a top surface of the shuttle, disposed on the linear track, and a process zone upper surface of one of the zones is between about 6 mm-12 mm, and a separation between each isolation surface and the substrate on the shuttle is less than about 1 mm.

11. A spatial atomic layer deposition (ALD) system, comprising,
   a chamber that includes,
      a first zone for delivery of first reactant gases to be absorbed by a surface of a substrate when present;
      a second zone for delivery of second reactant gases to be reacted with the first reactant gases that were absorbed by the surface of the substrate and isolation surfaces are disposed between the first zone and second, and each isolation surface has an input port to deliver inert gas and an output port to remove the inert gas and reactant gases;
   a shuttle configured to support the substrate and move the substrate on the shuttle along a linear track to transport the substrate to the first and second zones for a single deposition step, wherein the shuttle includes an RF power electrode and an RF ground electrode coupled to an RF power source; and
   a controller for synchronizing the RF power source to activate when the shuttle is moved to the second zone, wherein activating the RF power source enables generation of a plasma over a surface of the substrate when the second reactant gases are delivered to the second zone and the shuttle is located in the third zone, and the RF ground electrode is located in a center region of the shuttle and below a support surface used to support the substrate when present and the RF power electrode surrounds the RF ground electrode;
   wherein that said plasma is generated, when in the third zone, over the surface of substrate via excitation power provided by a flow of power from the RF power electrode to the RF ground electrode.

12. The spatial ALD system of claim 11, wherein a separation between each isolation surface and the substrate on the shuttle is less than about 1 mm.

* * * * *